United States Patent
Kimura et al.

(10) Patent No.: US 10,777,493 B2
(45) Date of Patent: Sep. 15, 2020

(54) SEMICONDUCTOR DEVICE MOUNTING BOARD AND SEMICONDUCTOR PACKAGE

(71) Applicant: KYOCERA Corporation, Kyoto-shi, Kyoto (JP)

(72) Inventors: Taito Kimura, Omihachiman (JP); Takayuki Shirasaki, Omihachiman (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/320,049

(22) PCT Filed: Jul. 24, 2017

(86) PCT No.: PCT/JP2017/026604
§ 371 (c)(1),
(2) Date: Feb. 25, 2019

(87) PCT Pub. No.: WO2018/021209
PCT Pub. Date: Feb. 1, 2018

(65) Prior Publication Data
US 2019/0221507 A1   Jul. 18, 2019

(30) Foreign Application Priority Data
Jul. 28, 2016   (JP) ................. 2016-148006

(51) Int. Cl.
*H01L 23/498*   (2006.01)
*H01L 23/12*   (2006.01)
*H05K 3/46*   (2006.01)

(52) U.S. Cl.
CPC ........ *H01L 23/49805* (2013.01); *H01L 23/12* (2013.01); *H01L 23/49822* (2013.01); *H05K 3/46* (2013.01)

(58) Field of Classification Search
CPC . H01L 25/043; H01L 25/0657; H01L 25/074; H01L 25/0756; H01L 25/117; H01L 33/48–648
(Continued)

(56) References Cited

U.S. PATENT DOCUMENTS

2006/0151614 A1* 7/2006 Nishizawa ........... G06K 19/077
  235/492
2010/0270668 A1* 10/2010 Marcoux ............... H01L 23/481
  257/690

(Continued)

FOREIGN PATENT DOCUMENTS

JP   05-218653 A   8/1993
JP   09-293826 A   11/1997
(Continued)

*Primary Examiner* — Jonathan Han
(74) *Attorney, Agent, or Firm* — Volpe and Koenig, P.C.

(57) ABSTRACT

A semiconductor device mounting board includes a first substrate, a second substrate, a single line, a groove, a feedthrough conductor, and a side conductor. The first substrate includes a mount area and a peripheral area. The second substrate is located in the peripheral area to align with an outer edge of the first substrate and surrounds the mount area. The signal line extends on an upper surface of the second substrate from an inner edge to an outer edge of the second substrate. The groove extends on a side surface of the first substrate from a lower surface to an upper surface of the first substrate. The feedthrough conductor is inside the second substrate and connected to the signal line. The side conductor is on an inner surface of the groove and electrically connected to the feedthrough conductor. The groove is inward from the outer edge of the second substrate.

9 Claims, 13 Drawing Sheets

(58) Field of Classification Search
USPC .............................. 257/685, 686, 723, 726,
257/E25.031–E25.032, E23.042; 438/6,
438/28, 66, 67, 107, 109, 406, 455–459
See application file for complete search history.

(56) References Cited

U.S. PATENT DOCUMENTS

2012/0094442 A1\* 4/2012 Lin ..................... H05K 1/021
438/118
2013/0322036 A1 12/2013 Tsujino
2014/0299894 A1\* 10/2014 Lin ..................... F21K 9/00
257/88

FOREIGN PATENT DOCUMENTS

| | | |
|---|---|---|
| JP | 11-097736 A | 4/1999 |
| JP | 11-312760 A | 11/1999 |
| JP | 2001-223286 A | 8/2001 |
| JP | 2004-179338 A | 6/2004 |
| JP | 2004-247627 A | 9/2004 |
| JP | 2009-266905 A | 11/2009 |
| JP | 2012-156428 A | 8/2012 |
| WO | 2012/165434 A1 | 12/2012 |

\* cited by examiner

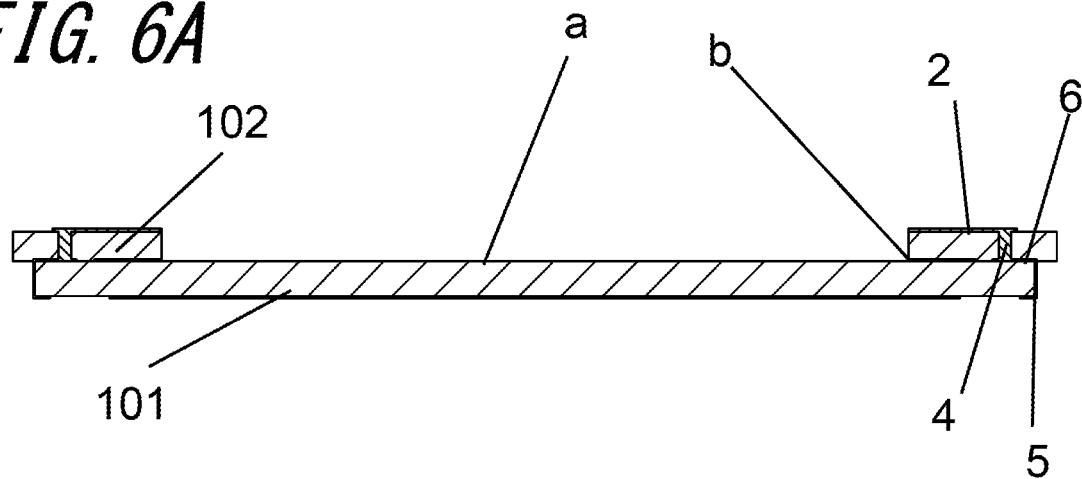
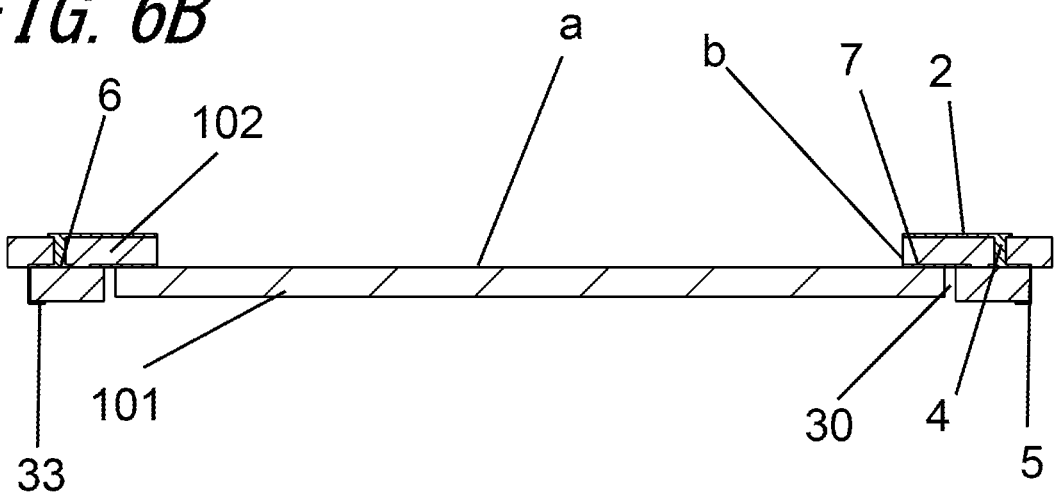

SEMICONDUCTOR DEVICE MOUNTING BOARD AND SEMICONDUCTOR PACKAGE

FIELD

The present invention relates to a semiconductor device mounting board on which a semiconductor device is mountable.

BACKGROUND

As semiconductor devices tend toward high-frequency response, the demand is increasing for semiconductor device mounting boards and semiconductor packages with high-performance that can improve frequency response of semiconductor devices. To obtain such semiconductor packages, a semiconductor device is mounted on a mount area on a semiconductor device mounting board, and the electrodes of the semiconductor device are electrically connected to signal lines by, for example, wire bonding to complete the product (refer to, for example, Japanese Unexamined Patent Application Publication No. 2012-156428). A known side conductor is mounted on the side surface of the semiconductor device mounting board to achieve electrical conduction to an external circuit board.

However, with the technique described in Japanese Unexamined Patent Application Publication No. 2012-156428, the side conductor on the side surface of the semiconductor device mounting board is uncovered and may be damaged due to external factors or may easily contact another electrode.

BRIEF SUMMARY

A semiconductor device mounting board according to one aspect of the present invention includes a first substrate, a second substrate, a single line, a groove, a feedthrough conductor, and a side conductor. The first substrate includes a mount area and a peripheral area. The second substrate is located in the peripheral area to align with an outer edge of the first substrate, and surrounds the mount area. The signal line is on an upper surface of the second substrate and extends from the inner edge to the outer edge of the second substrate. The groove is on a side surface of the first substrate and extends from a lower surface to an upper surface of the first substrate. The feedthrough conductor is inside the second substrate and connected to the signal line. The side conductor is on an inner surface of the groove and electrically connectable to the feedthrough conductor and an electrode on the upper surface of the first substrate. The groove is inward from the outer edge of the second substrate in a plan view.

A semiconductor package according to another aspect of the present invention includes the semiconductor device mounting board described above, and a semiconductor device. The semiconductor device is mountable in the mount area and electrically connected to the signal line.

BRIEF DESCRIPTION OF DRAWINGS

FIG. 6A is a cross-sectional view of a semiconductor device mounting board according to an embodiment of the present invention taken along line A-A in FIG. 4, and FIG. 6B is a cross-sectional view of a semiconductor device mounting board according to another embodiment of the present invention taken along line A-A in FIG. 4.

FIG. 9A shows a metal layer on the upper surface of a third substrate, FIG. 9B shows signal lines and a ground conductor layer on the upper surface of a second substrate, FIG. 9C shows a first ground conductor layer and electrodes on the upper surface of a first substrate, and FIG. 9D shows a metal layer on the lower surface of the first substrate.

DETAILED DESCRIPTION

Figure 1:
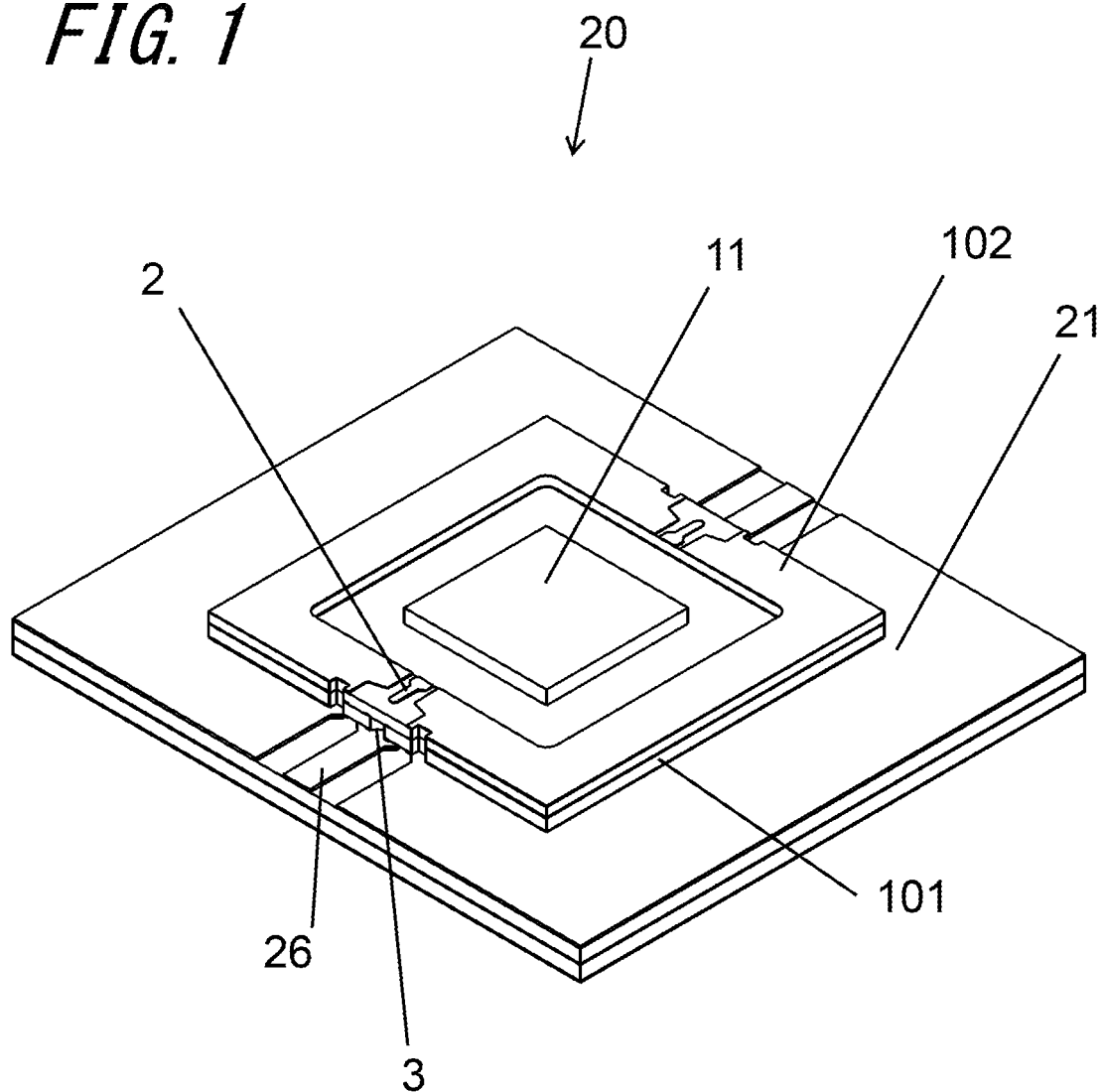
FIG. 1 is a perspective view of a semiconductor package according to an embodiment of the present invention.

A semiconductor device mounting board 1 according to an embodiment of the present invention will now be described in detail with reference to the drawings. The same components are given the same reference numerals in the figures.

Structure of Semiconductor Device Mounting Board

Figure 2A:
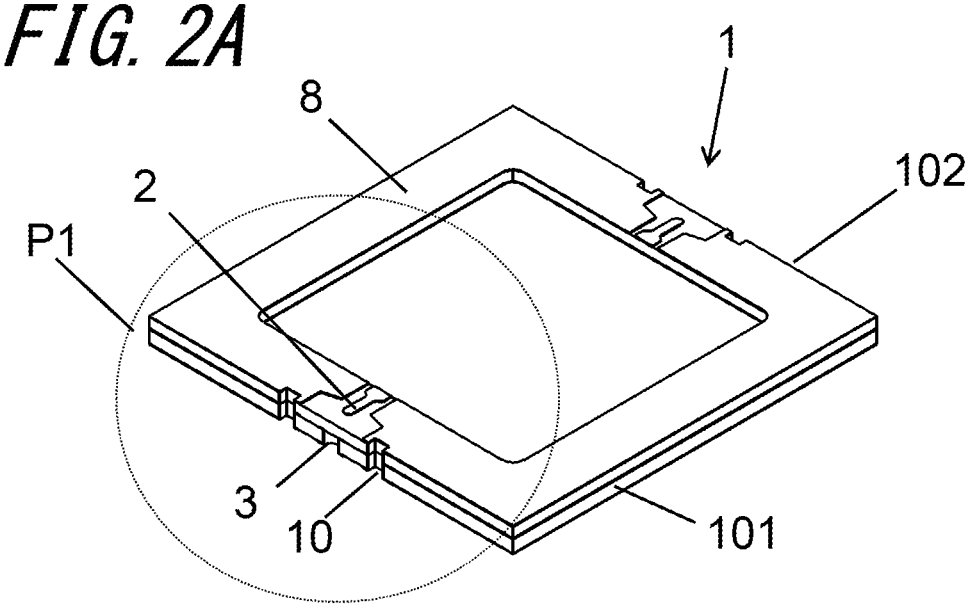
FIG. 2A is a top perspective view of a semiconductor device mounting board according to the embodiment of the present invention.
Figure 2B:
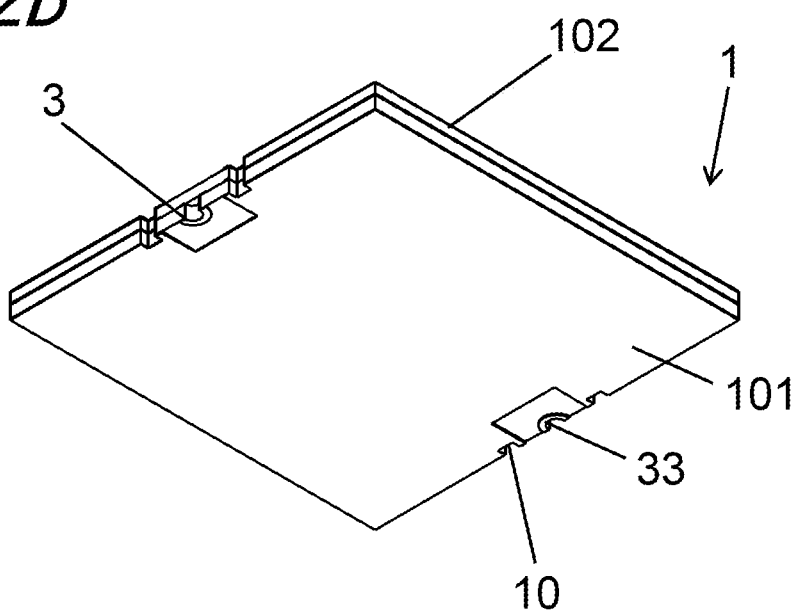
FIG. 2B is a bottom perspective view of the semiconductor device mounting board.
Figure 3:
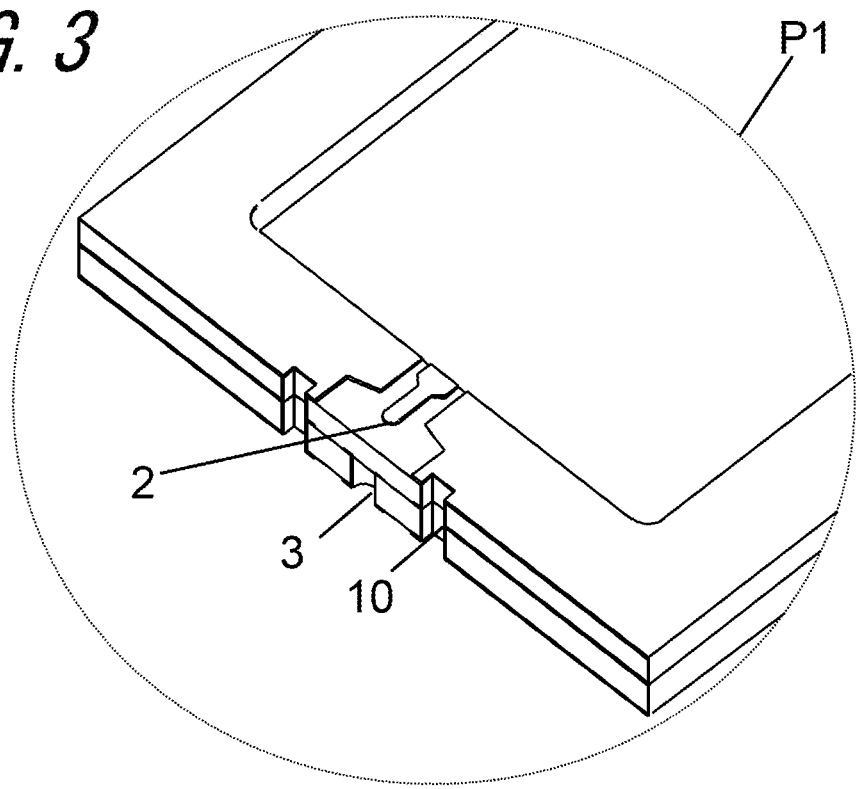
FIG. 3 is an enlarged view of an area P1 on the semiconductor device mounting board according to the embodiment of the present invention shown in FIG. 2A.
Figure 4:
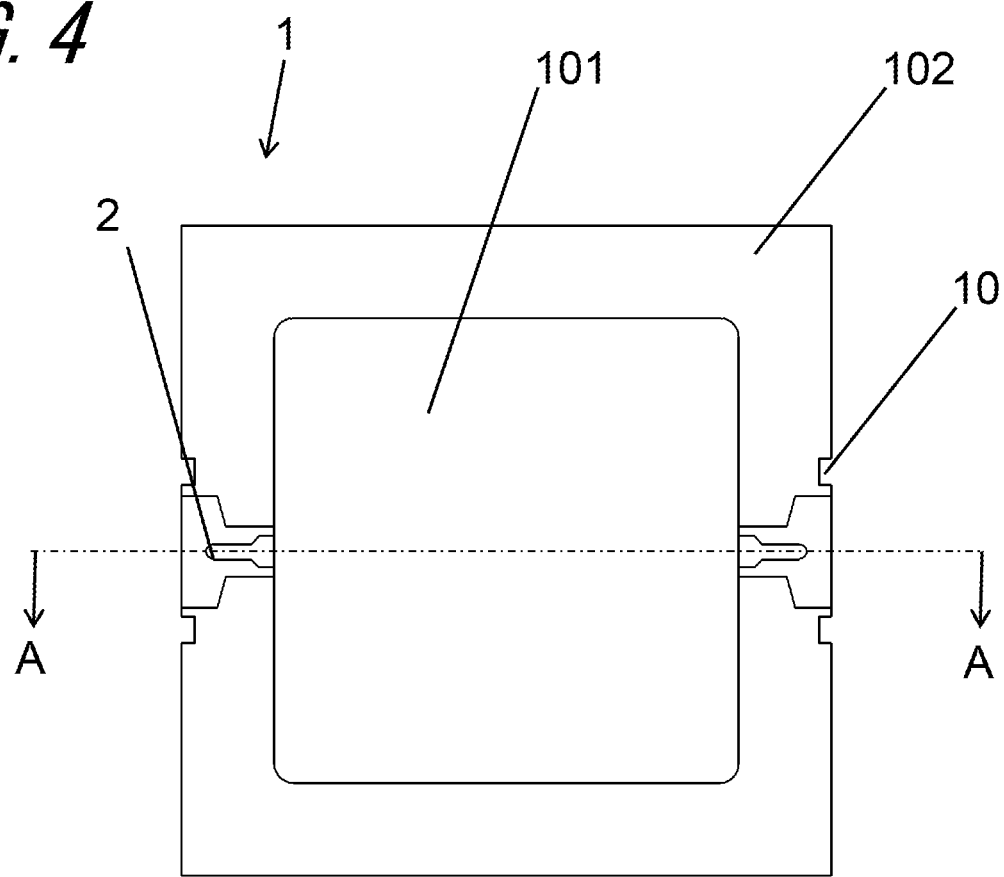
FIG. 4 is a plan view of the semiconductor device mounting board according to the embodiment of the present invention.
Figure 5A:
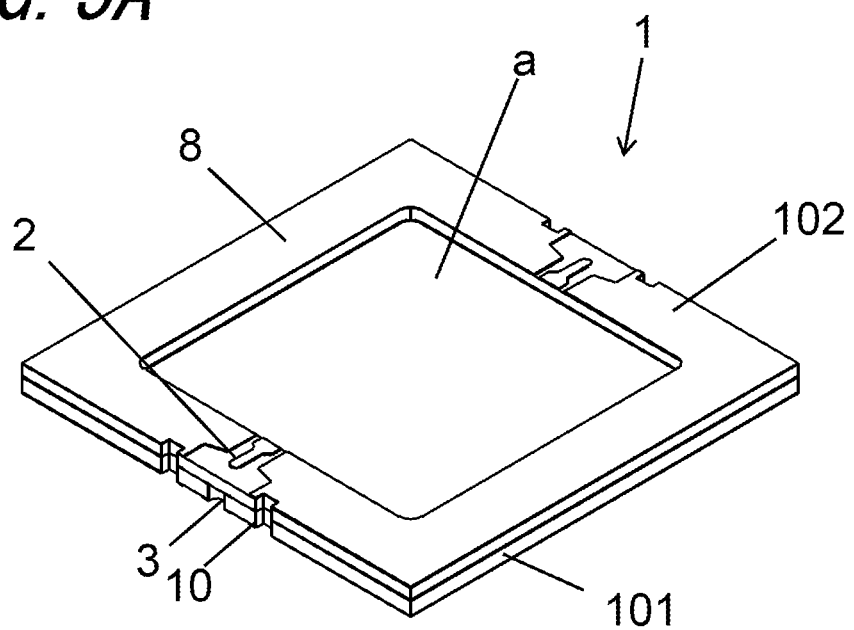
FIG. 5A is a top perspective view of a semiconductor device mounting board according to another embodiment of the present invention.
Figure 5B:
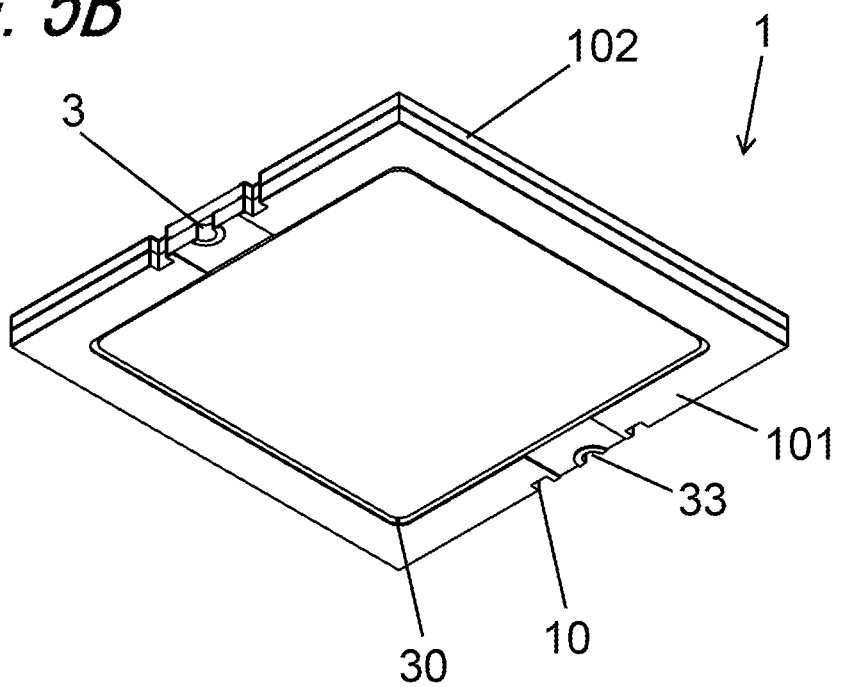
FIG. 5B is a bottom perspective view of the semiconductor device mounting board.

FIG. 1 is a perspective view of a semiconductor package 20 according to an embodiment of the present invention. FIG. 2A is a top perspective view of the semiconductor device mounting board 1 according to the embodiment of the present invention, and FIG. 2B is a bottom perspective view of the semiconductor device mounting board 1. FIG. 3 is an enlarged view of an area P1 on the semiconductor device mounting board according to the embodiment of the present invention shown in FIG. 2A. FIG. 4 is a plan view of the semiconductor device mounting board 1 according to the embodiment of the present invention. FIG. 5A is a top perspective view of the semiconductor device mounting board 1 according to another embodiment of the present invention, and FIG. 5B is a bottom perspective view of the semiconductor device mounting board 1. FIG. 6A is a cross-sectional view of the semiconductor device mounting board 1 according to an embodiment of the present invention taken along line A-A in FIG. 4, and FIG. 6B is a cross-sectional view of the semiconductor device mounting board 1 according to another embodiment of the present invention taken along line A-A in FIG. 4. In these drawings, the semiconductor package 20 and the semiconductor device mounting board 1 include a first substrate 101, a second substrate 102, signal lines 2, grooves 3, feedthrough conductors 4, and side conductors 5.

Figure 7A:
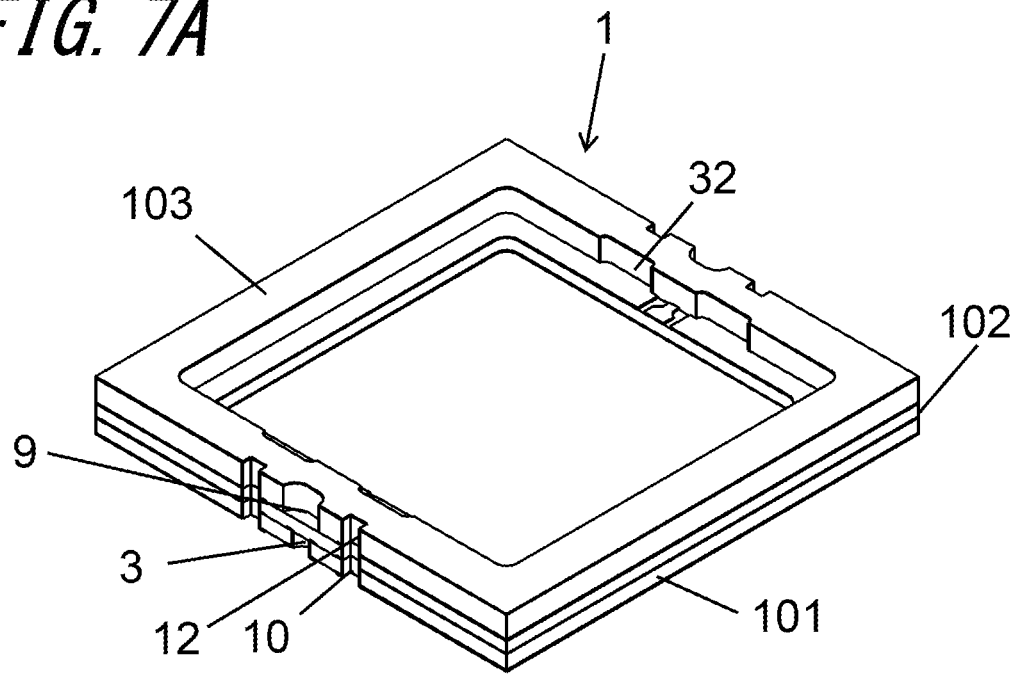
FIG. 7A is a top perspective view of a semiconductor device mounting board according to another embodiment of the present invention.
Figure 7B:
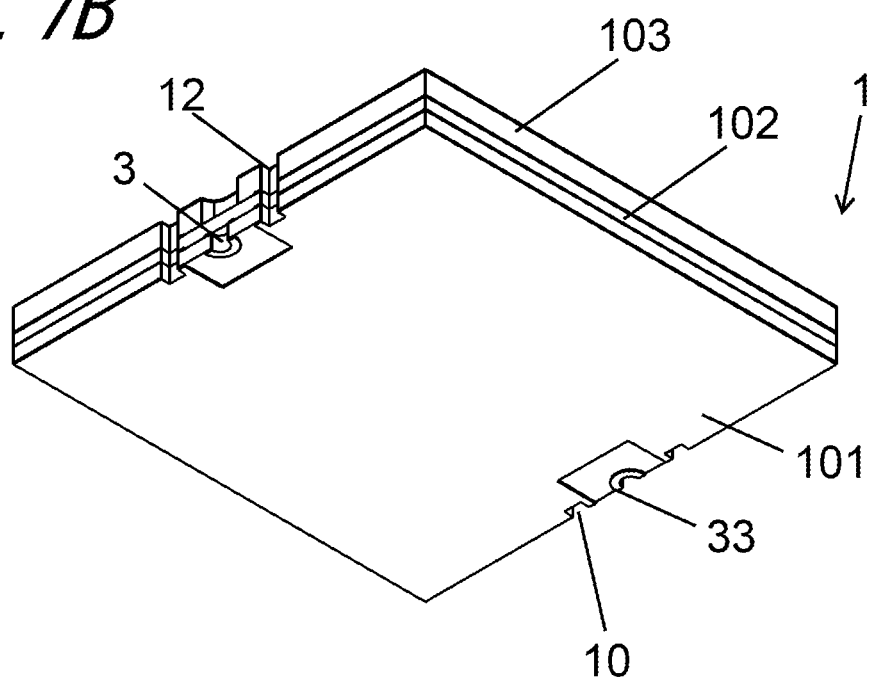
FIG. 7B is a bottom perspective view of the semiconductor device mounting board.
Figure 8A:
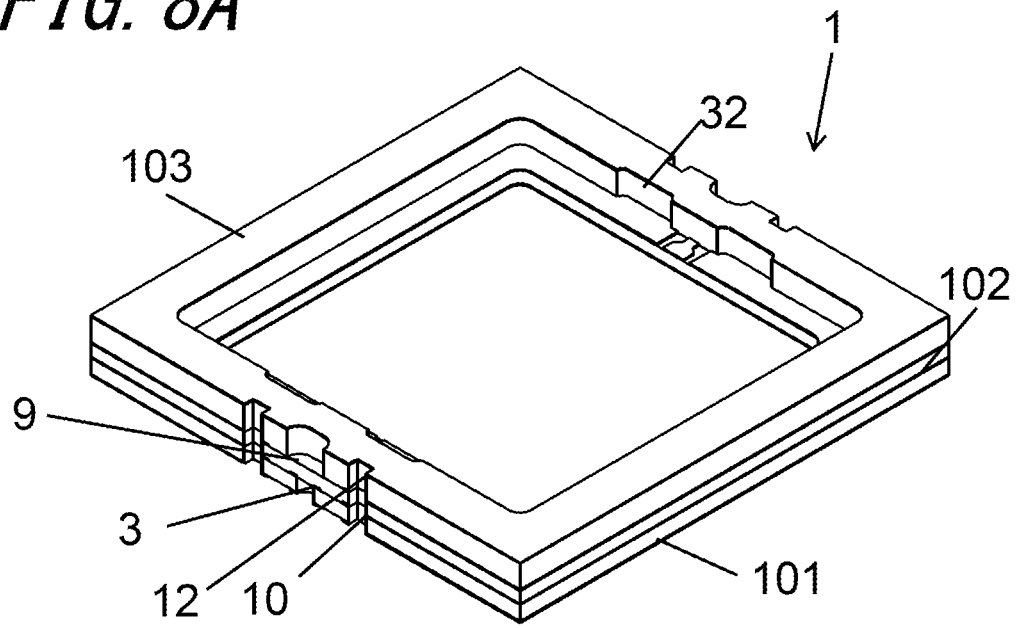
FIG. 8A is a top perspective view of a semiconductor device mounting board according to another embodiment of the present invention.
Figure 8B:
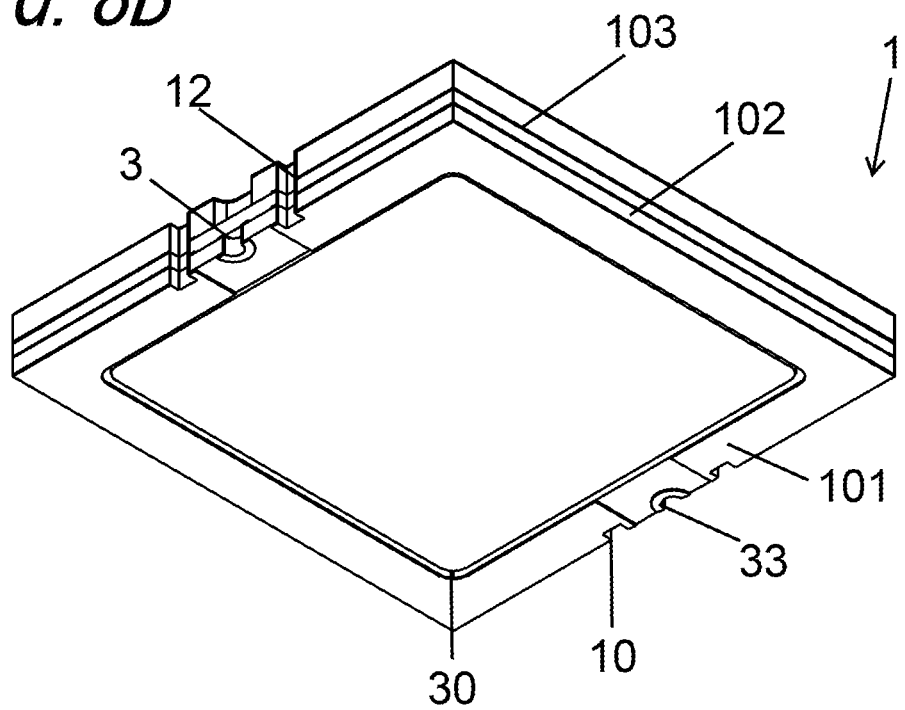
FIG. 8B is a bottom perspective view of the semiconductor device mounting board.
Figure 9A:
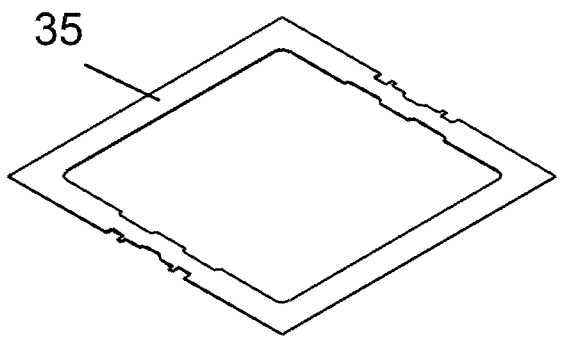
FIGS. 9A to 9D are exploded perspective views of a semiconductor device mounting board according to another embodiment of the present invention showing its conductors.
Figure 9B:
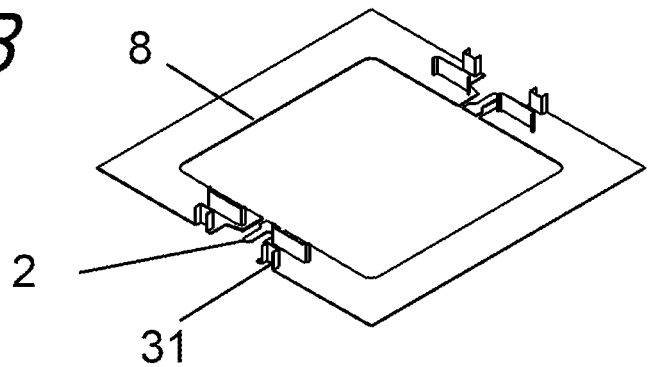
Figure 9C:
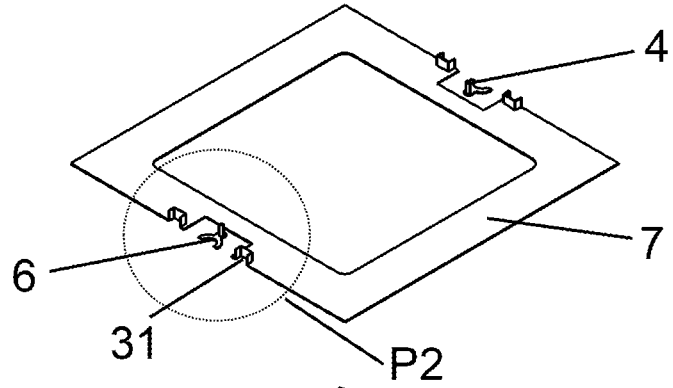
Figure 9D:
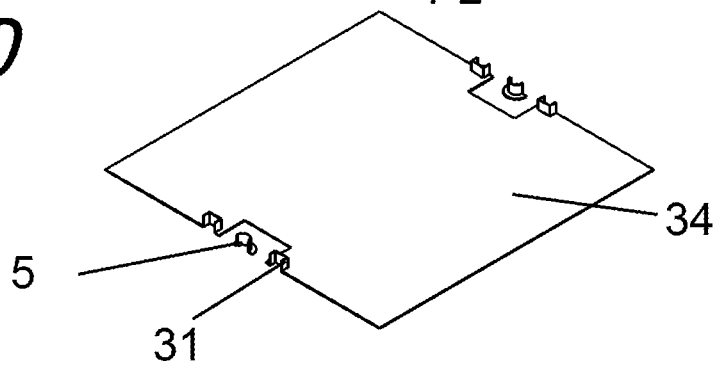
Figure 10:
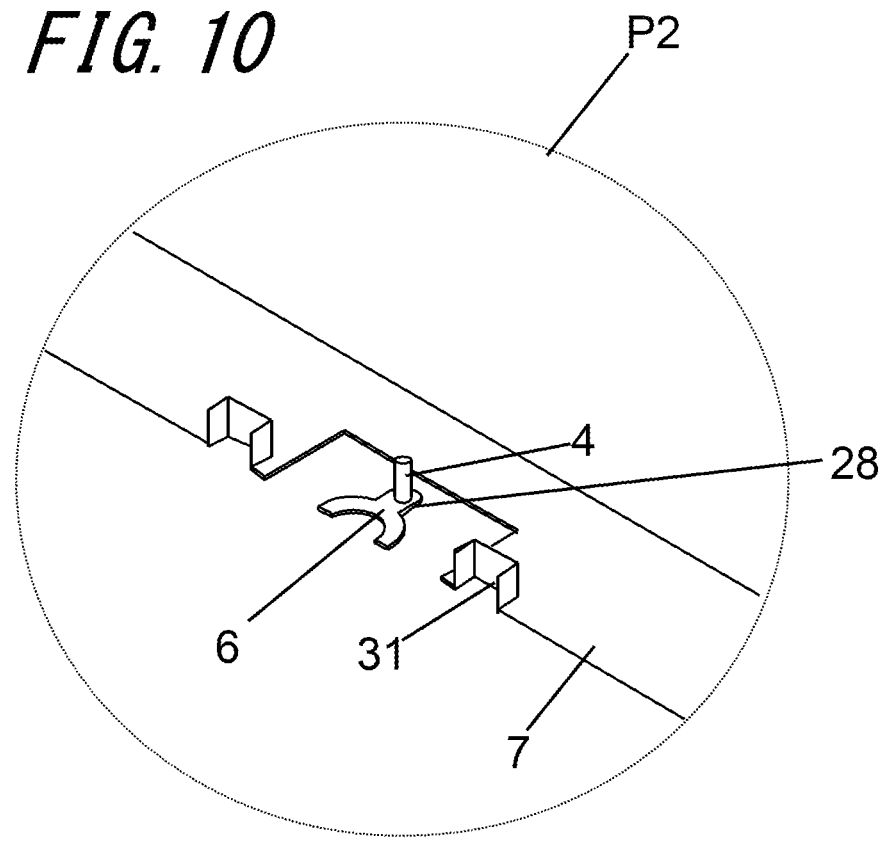
FIG. 10 is an enlarged view of an area P2 of the first ground conductor layer and the electrodes on the upper surface of the first substrate shown in FIG. 9C.

The semiconductor device mounting board 1 according to another embodiment of the present invention may further include a third substrate 103 as shown in FIG. 7A to FIG. 9D. FIG. 7A is a top perspective view of the semiconductor device mounting board 1 according to another embodiment of the present invention, and FIG. 7B is a bottom perspective view of the semiconductor device mounting board 1. FIG. 8A is a top perspective view of the semiconductor device mounting board 1 according to another embodiment of the present invention, and FIG. 8B is a bottom perspective view of the semiconductor device mounting board 1. FIGS. 9A to 9D are exploded perspective views of a semiconductor device mounting board according to another embodiment of the present invention showing its conductors, and FIG. 9A shows a metal layer 35 on the upper surface of the third substrate 103, FIG. 9B shows signal lines 2 and a second ground conductor layer 8 on the upper surface of a second substrate 102, FIG. 9C shows a first ground conductor layer 7, feedthrough conductors 4, and electrodes 6 on the upper surface of the first substrate 101, and FIG. 9D shows a metal layer 34 and side conductors 5 on the lower surface of the first substrate 101. FIG. 10 is an enlarged view of an area P2 of the first ground conductor layer 7, the feedthrough conductor 4, and the electrode 6 on the upper surface of the first substrate shown in FIG. 9C.

The semiconductor device mounting board 1 includes the first substrate 101 and a second substrate 102. The first substrate 101 has a mount area a on its upper surface, on which a semiconductor device 11 is mountable, and a peripheral area b, which surrounds the mount area a. The first substrate 101 is formed from ceramics such as sintered alumina ($Al_2O_3$) or alumina ceramics.

The second substrate 102 is located in the peripheral area b of the first substrate 101. In a plan view of the semiconductor device mounting board 1, the outer edge of the second substrate 102 is aligned with the outer edge of the first substrate 101. The second substrate 102 has a frame shape surrounding the mount area a. In the same manner as the first substrate 101, the second substrate 102 is formed from ceramics such as sintered alumina ($Al_2O_3$) or alumina ceramics.

The second substrate 102 has signal lines 2 on its upper surface. Each signal line 2 extends from one end on the inner edge of the second substrate 102 toward the other end on the outer edge of the second substrate 102. The signal lines 2 are formed from, for example, iron, copper, nickel, gold, chromium, cobalt, molybdenum, manganese, tungsten, or an alloy of any of these materials. The signal lines 2 are connected to the semiconductor device 11.

The first substrate 101 has grooves 3 on the side surfaces, and side conductors 5 in the grooves 3. The grooves 3 extend from the lower surface to the upper surface of the first substrate 101. The side conductors 5 are located on the inner surfaces of the grooves 3 and connected to the signal lines 2, and the electrodes 6 and the feedthrough conductors 4 (described later). In a plan view of the semiconductor device mounting board 1, the grooves 3 are located inward from the outer edge of the second substrate 102. The side conductors 5 are formed from, for example, iron, copper, nickel, gold, chromium, cobalt, molybdenum, manganese, tungsten, or an alloy of any of these materials.

The feedthrough conductors 4, which are electrically connected to the signal lines 2, extend through the second substrate 102 from the upper to lower surfaces of the substrate. The feedthrough conductors 4 are also electrically connected to the side conductors 5 through the electrodes 6 around the upper ends of the grooves 3 on the upper surface of the first substrate 101. The feedthrough conductors 4 are located at positions overlapping the other end of the corresponding signal line 2 and electrically connected to the end. This structure can more reliably transmit high-frequency electric signals from the feedthrough conductors 4 to the signal lines 2, and reduce transmission loss or reflection loss of the transmitted high-frequency electric signals.

In a plan view, the grooves 3 are inward from the outer edge of the second substrate 102. In other words, the second substrate 102 is partially exposed along the grooves 3. The side conductors 5 in the grooves 3 thus reliably retain electrical conduction. In other words, this structure lowers the likelihood that the side conductors 5 are damaged or short-circuited due to external factors.

In a plan view, the outer edge of the second substrate 102 may be located outward from the outer edge of the first substrate 101. In this structure, the second substrate 102 has portions above the grooves 3 extending more outward from the grooves 3. In other words, the side conductors 5 in the grooves 3 are less susceptible to external factors, and reliably retain electrical conduction. This structure further lowers the likelihood that the side conductors 5 are damaged or short-circuited due to external factors.

As shown in FIGS. 6A, 6B, and 10, the semiconductor device mounting board 1 also includes the electrodes 6 and the first ground conductor layer 7. The electrodes 6 are located on the upper surface of the first substrate 101 or the lower surface of the second substrate 102 between the first substrate 101 and the second substrate 102, and electrically connected to the side conductors 5. The first ground conductor layer 7 is spaced from the electrodes 6. In the semiconductor device mounting board 1, the electrodes 6 serve as a signal conductor layer, and the first ground conductor layer 7 serves as a ground conductor layer. This structure of the semiconductor device mounting board 1 including the electrodes 6 surrounded by the first ground conductor layer 7 can reduce the characteristic impedance of the side conductors 5 and the electrodes 6. This structure also lowers the likelihood that an electric field generated in a signal transmission portion from each side conductor 5 to the corresponding feedthrough conductor 4 through the electrode 6 extends in an unintended area, and allows electric field coupling between the electrode 6 and the first ground conductor layer 7. This structure thus regulates the distribution of the electric field of the signal transmission portion. This structure can transmit high-frequency electric signals through electric field coupling between the electrodes 6 and the first ground conductor layer 7. This structure stabilizes the characteristic impedance of the signal transmission portion.

More specifically, the semiconductor device mounting board 1 has the signal transmission portions surrounded by the ground potential portions, and thus regulates the distribution of the electric fields of the signal transmission portions. The semiconductor device mounting board 1 thus reduces variations in the characteristic impedance of the signal transmission portions. Thus, the high-performance semiconductor device mounting board 1 and the semiconductor package 20 can improve frequency response.

When the side conductors 5 are electrically connected to an external mounting board with an electrically conductive bond such as solder, the bond forms a meniscus at the lower ends of the inner surfaces of the grooves 3. In this structure, the side conductors 5 are stably electrically connected to the external mounting board. In other words, the semiconductor device mounting board 1 reduces variations in the characteristic impedance of the signal transmission portions, and improves the frequency response.

The semiconductor device mounting board 1 may further include second ground conductor layers 8 on the upper surface of the second substrate 102 to surround the signal lines 2. This structure forms coplanar lines in which the signal transmission portions are between the ground potential portions on the upper surface of the second substrate 102. The semiconductor device mounting board 1 further improves frequency response in the signal transmission portions. The first ground conductor layer 7 between the first substrate 101 and the second substrate 102 and spaced from the electrodes 6 is located under the signal lines 2 and the second ground conductor layers 8. This structure forms grounded coplanar lines. The semiconductor device mounting board 1 thus further improves frequency response in the signal transmission portions.

As shown in FIGS. 6A, 6B, and 10, each electrode 6 is located on the upper surface of the first substrate 101 or the lower surface of the second substrate 102 around the upper end of the corresponding groove 3 (the end facing the second substrate 102) in the direction perpendicular to the direction in which the corresponding side conductor 5 extends. Each electrode 6 is electrically connected to the corresponding side conductor 5. In a bottom view, the outer edge of each electrode 6 is located inward from the outer edge of the side conductor 5 toward the semiconductor device mounting board 1. In other words, each electrode 6 in a bottom view is not exposed on the lower surface of the second substrate 102. In the structure including the electrodes 6 not exposed on the lower surface of the second substrate 102, an electrically conductive bond, such as solder, used for electrically connecting the semiconductor package 20 to a mounting board avoids spreading to the electrodes 6 through the side conductors 5. This structure can thus reduce stress resulting from the difference in thermal expansion coefficients between the second substrate 102 and the bond. This structure also reduces unstable variations in the characteristic impedance due to spreading of the bond. The side conductors 5 and the electrodes 6, which serve as the signal transmission portions, thus more reliably retain frequency response.

As shown in FIG. 10, the electrode 6 includes a second connection terminal 28, which serves as an inner-layer connection terminal protruding in the direction away from the groove 3. The feedthrough conductor 4 is connected to the surface of the second connection terminal 28 facing the second substrate 102. The electrode 6 is thus electrically connected to the signal line 2 with the second connection terminal 28 and the feedthrough conductor 4. The semiconductor device mounting board 1 thus has a large capacitance between the electrode 6 and the second connection terminal 28, and the first ground conductor layer 7. This structure is less likely to reduce the characteristic impedance. The signal transmission portion including each electrode 6 and the second connection terminal 28 thus easily achieves intended characteristic impedance. The semiconductor device mounting board 1 can be downsized, and can further improve the frequency response in the signal transmission portion.

In a plan view, the second connection terminal 28 extends linearly from the center of the outer edge of the electrode 6 away from the groove 3, and has the feedthrough conductor 4 connected to the surface facing the second substrate 102. The semiconductor device mounting board 1 can have the shorter signal transmission portion including the electrode 6 and the second connection terminal 28, and further improves frequency response.

The semiconductor device mounting board 1 also includes side ground conductors 31, which extend from side surfaces of the first substrate 101 to side surfaces of the second substrate 102 on both sides of the grooves 3. In this structure, each signal transmission portion is between the ground potential portions also on the side surface. This structure of the semiconductor device mounting board 1 reduces unintended and unstable distribution of the electric fields in the signal transmission portions, and reduces variations in the characteristic impedance. Thus, the semiconductor device mounting board 1 further improves frequency response. The side ground conductors 31 may continuously extend from a side surface of the first substrate 101 to a side surface of the second substrate 102 on both sides of the corresponding groove 3. Thus, the semiconductor device mounting board 1 stabilizes the potential of the side ground conductors 31. In a plan view, each side ground conductor 31 on a side surface of the first substrate 101 may be aligned with the corresponding side ground conductor 31 on a side surface of the second substrate 102. The semiconductor device mounting board 1 reduces unintended and unstable distribution of the electric fields in the signal transmission portions, and reduces variations in the characteristic impedance in a more reliable manner.

As shown in FIG. 10, each electrode 6 has a substantially semi-circular profile in a plan view. This structure facilitates formation of the electrode 6 in manufacturing processes of the semiconductor device mounting board 1, and reduces stress concentration along the profile of the electrode 6. The semiconductor device mounting board 1 further reduces distorted distribution of the electric field along the profile of the electrode 6. This structure of the semiconductor device mounting board 1 thus lowers the likelihood that the electrode 6 is separated under stress along the profile of the electrode 6, or the first substrate 101 or the second substrate 102 crack, and further improves frequency response in the signal transmission portions. Signal electrodes 33 on the lower surface each have a substantially semi-circular profile in a plan view. With the same advantageous effects as described above, this structure stabilizes electrical connection between the semiconductor device 11 and an external mounting board, and improves the frequency response. When the semiconductor package 20 is mounted on an external mounting board with the signal electrodes 33 on the lower surface using a connection member such as solder, less stress concentrates around the signal electrodes 33 on the lower surface and the connection member.

In some embodiments, an inner peripheral wall of the second substrate 102 surrounding the mount area a may include inner surface grooves 32 on both sides of the signal line 2 in a plan view of the semiconductor device mounting board 1. An inner surface ground conductor serving as a ground potential is located on the inner surface of each inner surface groove 32. The semiconductor device mounting board 1 with this structure reduces unintended and unstable distribution of the electric field at the end of the signal lines 2 adjacent to the mount area a, and reduces variations in the characteristic impedance. The semiconductor device mounting board 1 thus further improves frequency response.

As shown in FIGS. 5B, 6B, and 8B, a semiconductor device mounting board 1 according to another embodiment of the present invention may have a gap 30 in the lower surface of the first substrate 101, which is lower than the first ground conductor layer 7 and includes the signal electrodes 33. The gap 30 surrounds the mount area a in a plan view. The temperature inside the semiconductor device mounting board 1 changes or varies with heat generated by the semiconductor device 11 in manufacturing the semiconductor device mounting board 1 or the semiconductor package 20, or in operating the semiconductor package 20. This temperature change can cause thermal expansion or contraction of the semiconductor device mounting board 1 or the semiconductor device 11, thus generating stress. The gap 30 may reduce the stress in the semiconductor device mounting board 1. This structure lowers the likelihood that the semiconductor device mounting board 1 breaks or cracks. This structure also reduces deformation or warpage of the mount area a caused by deformation or warpage of the substrate 101 and allows the semiconductor device 11 to be stably mounted in the mount area a. This lowers the likelihood that the semiconductor device 11 breaks under such deformation or warpage in the mount area a.

In a small-sized semiconductor device mounting board 1 with a shorter distance between the first ground conductor layer 7 and the side conductors 5, the signal electrodes 33 on the bottom surface, and the electrodes 6, the gap 30 lowers the likelihood that the capacitance increases between each signal transmission portion and the ground potential portion and the characteristic impedance decreases. The signal transmission portion thus easily achieves intended characteristic impedance. The semiconductor device mounting board 1 can be downsized, and can further improve the frequency response in the signal transmission portion.

The mount area a of the semiconductor device mounting board 1 may be formed from a metal. More specifically, the mount area a may be formed from a metal such as iron, copper, nickel, chromium, cobalt, or tungsten, or an alloy of any of these metals. The mount area a is electrically connected to the first ground conductor layer 7 with an electrically conductive bond, such as solder or brazing material. This structure improves heat dissipation from the semiconductor device mounting board 1. The first ground conductor layer 7, a ground conductor 22, and the side ground conductors 31 are connected to a ground layer 25, which is arranged on an external mounting board as described later, through the mount area a to stabilize the ground potentials. This structure increases the area over which the mount area a, which serves as a ground potential of the semiconductor device mounting board 1, is joined with the ground conductor on the external mounting board. This structure further stabilizes the ground potential of the semiconductor device mounting board 1 including the mount area a.

The semiconductor device mounting board 1 can further improve frequency response in the signal transmission portions. With the advantageous effects described above, the semiconductor device mounting board 1 including the gap 30 in the first substrate 101 reduces breaks and cracks in the semiconductor device mounting board 1 and thus reduces breaks in the semiconductor device 11. The semiconductor device mounting board 1 can further improve frequency response in the signal transmission portions.

In a plan view, the grooves 3 are, for example, semi-elliptic or semi-circular. The groove 3 is curved. The temperature inside the semiconductor device mounting board 1 changes or varies with heat generated by the semiconductor device 11 in manufacturing the semiconductor device mounting board 1 or the semiconductor package 20, or in operating the semiconductor package 20. This temperature change may cause thermal expansion or contraction of the semiconductor device mounting board 1, thus generating stress. Each groove 3 with a curve is less likely to receive concentrated stress, and thus prevents the first substrate 101, the side conductor 5, the electrode 6, the signal electrode 33 on the bottom surface, and the side ground conductor 31 from breaking or cracking. In a plan view, each groove 3 has the same profile as the electrode 6. With the advantageous effect described above, the semiconductor device mounting board 1 reduces stress concentration on specific portions of the groove 3 and the electrode 6.

As shown in FIG. 3, in a side view, the first substrate 101 and the second substrate 102 may have recesses 10 on their side surfaces. The recesses 10 extend from the lower surface of the first substrate 101 to the upper surface of the second substrate 102 on both sides of each groove 3 at positions spaced from each groove 3. Each recess 10 may receive the side ground conductor 31 on its inner circumferential surface. This structure increases the area of the side ground conductor 31, which serves as a ground conductor, and thus further stabilizes the ground potential of the semiconductor device mounting board 1. This structure further reduces unintended and unstable distribution of the electric field around the side conductors 5, and reduces variations in the characteristic impedance in a more reliable manner.

As shown in FIGS. 7A to 9D, the semiconductor device mounting board 1 further includes a third substrate 103 on the upper surface of the second substrate 102. The third substrate 103 is formed from, for example, the same material as the first substrate 101 and the second substrate 102, and has the same profile in a plan view. For example, the third substrate 103 has, on side surfaces, second recesses 12 and cutouts 9 at positions overlapping the grooves 3 in a plan view. The cutouts 9 receive no ground conductor on the inner surface, whereas the second recesses 12 continuously receive the side ground conductors 31 on the inner surfaces. The third substrate 103 with no ground conductor on the inner surfaces of the cutouts 9 has a smaller distance between the signal lines 2 and the ground conductors 22 as the size of the semiconductor device mounting board 1 is reduced. This structure including the cutouts 9 lowers the likelihood that the capacitance increases between each signal transmission portion and the ground potential portion and the characteristic impedance decreases. In a plan view, each cutout 9 has a larger profile than the groove 3. The semiconductor device mounting board 1 thus reduces stress concentration on the second substrate 102 between the grooves 3 and the cutouts 9. The second substrate 102 is thus prevented from cracking or breaking. The recesses 10 and the second recesses 12 may have the same profile in a plan view. This reduces stress concentration on the interface between the recesses 10 and the second recesses 12. This structure reduces unintended and unstable distribution of the electric field around each side conductor 5, which forms the signal transmission portion of the semiconductor device mounting board 1, and reduces variations in the characteristic impedance. Thus, the semiconductor device mounting board 1 further improves frequency response in the signal transmission portions.

As shown in FIGS. 9A to 9D, the first substrate 101 may have the metal layer 34, which serves as a lower surface, on its lower surface, and the third substrate 103 may have the metal layer 35, which serves as an upper surface, on its upper surface. The metal layer 34 on the lower surface facilitates electrical connection to a mounting board. The semiconductor device mounting board 1 improves heat dissipation characteristics through the metal layer 34. The metal layer 35 on the upper surface, which receives the electric field generated to transmit high-frequency electric signals to the signal lines 2 through electric field coupling, reduces unintended and unstable distribution of the electric field around the signal lines 2. The semiconductor device mounting board 1 thus further improves frequency response in the signal transmission portions.

Thermal stress occurs with heat of the semiconductor device 11 generated in manufacturing the semiconductor device mounting board 1 or the semiconductor package 20, or in operating the semiconductor package 20. The grooves 3 and the recesses 10 having the same profile and the cutouts 9 and the second recesses 12 having the same profile reduce thermal stress concentrating on the joint interfaces between the grooves 3 and the recesses 10, and between the cutouts 9 and the second recesses 12, as described above. The third substrate 103 has the second recesses 12, which receive the side ground conductors 31 on the inner surface. This structure reduces unintended and unstable distribution of the electric field at the ends of the signal lines 2 adjacent to the grooves 3, and reduces variations in the characteristic impedance. Thus, the semiconductor device mounting board 1 further improves frequency response.

Structure of Semiconductor Package

Figure 11:
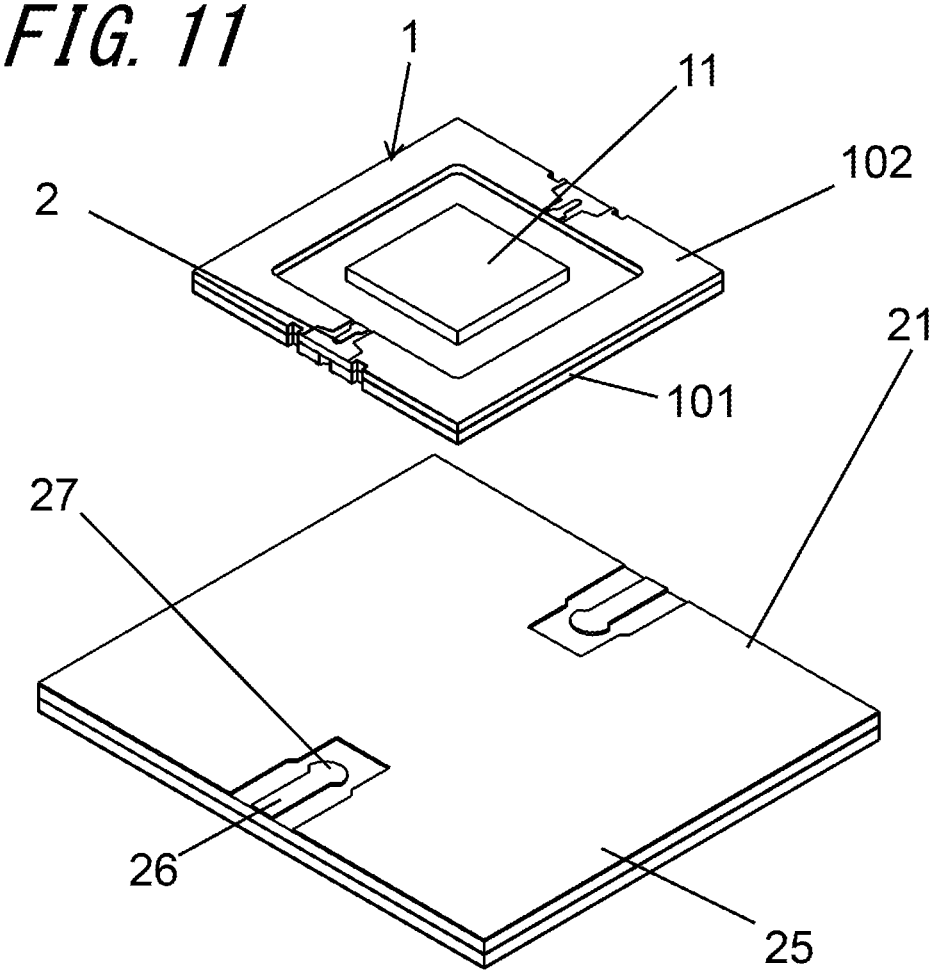
FIG. 11 is an exploded perspective view of a semiconductor package according to an embodiment of the present invention.

FIG. 11 is an exploded perspective view of the semiconductor package 20 according to an embodiment of the present invention. To assemble the semiconductor package 20, the semiconductor device 11 is placed in the mount area a of the substrate 101, and is fixed to the substrate 2 by bonding with, for example, an adhesive. The semiconductor device 11 is then electrically connected to the signal lines 2 by, for example, wire bonding. The semiconductor device 11 is mounted on the semiconductor device mounting board 1 to complete the semiconductor package 20 as a product.

Figure 12:
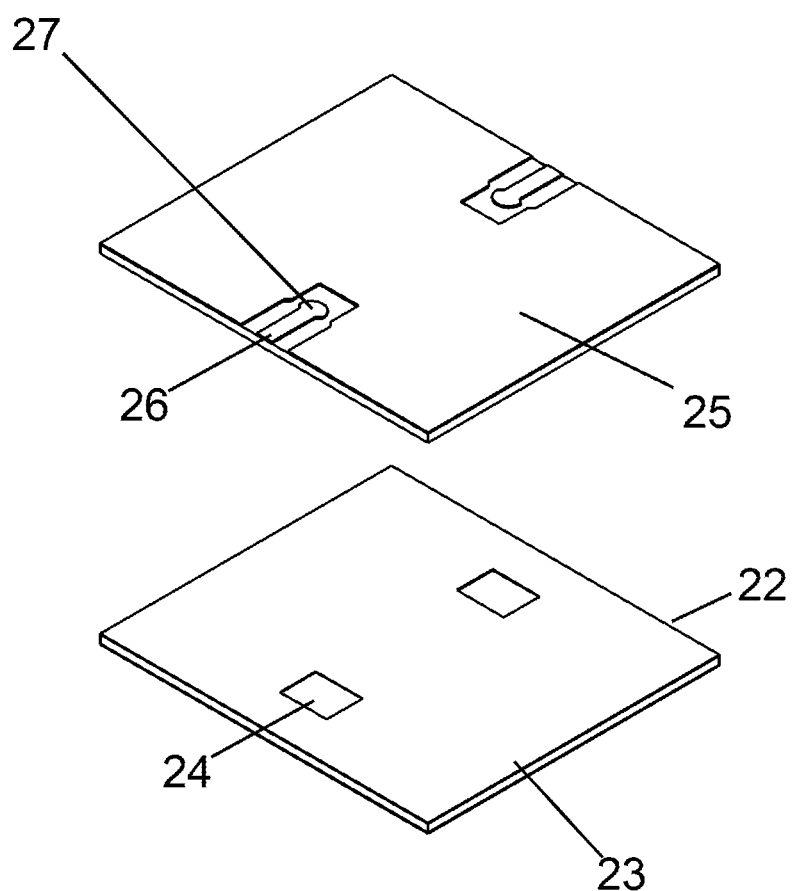
FIG. 12 is an exploded perspective view of a mounting board on which a semiconductor package according to an embodiment of the present invention is mountable.
Figure 13A:
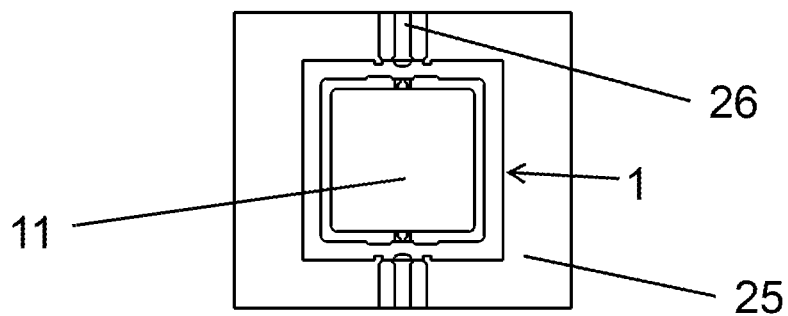
FIG. 13A is a plan view of a semiconductor package according to another embodiment of the present invention.
Figure 13B:
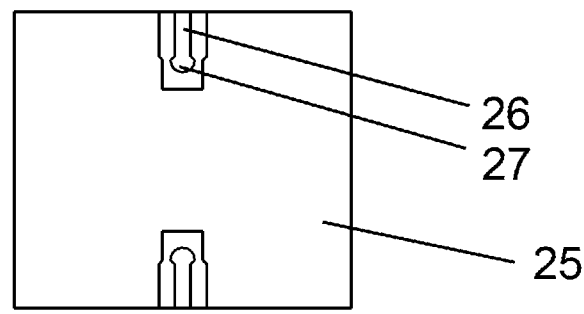
FIG. 13B is a plan view of a mounting board in the semiconductor package.
Figure 13C:
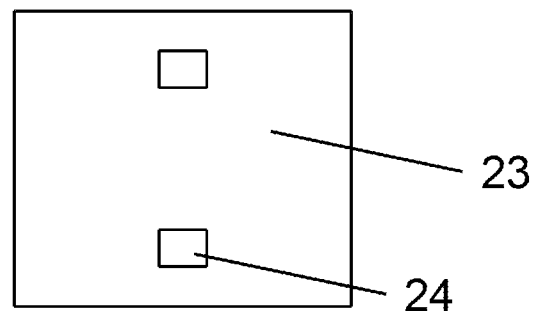
FIG. 13C is a plan view of a second layer of the mounting board.
Figure 13D:
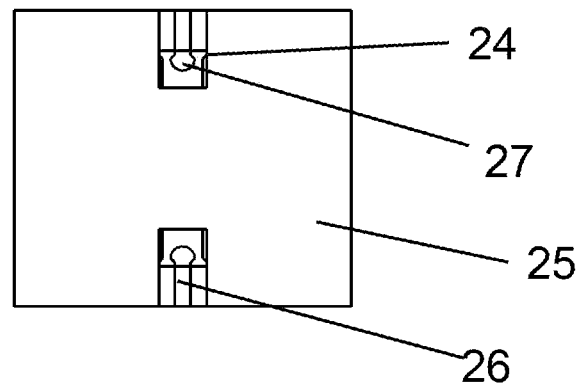
FIG. 13D is a transparent plan view of the mounting board.
Figure 14:
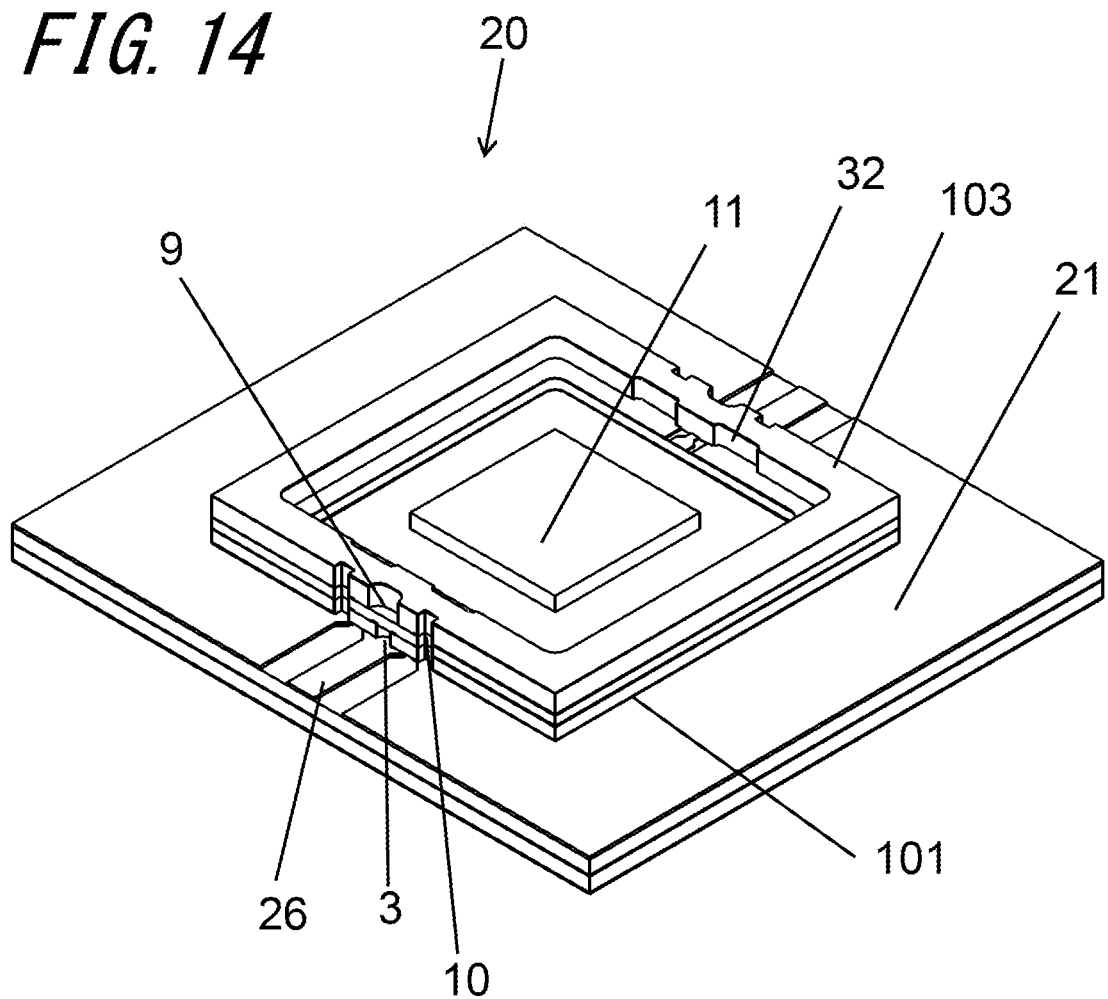
FIG. 14 is a perspective view of a semiconductor package according to another embodiment of the present invention.

Another embodiment of the semiconductor package 20 will now be described with reference to FIGS. 12 to 14. FIG. 12 is an exploded perspective view of a mounting board 21 on which the semiconductor package 20 according to an embodiment of the present invention is mountable. FIG. 13A is a plan view of the semiconductor package 20 according to another embodiment of the present invention, FIG. 13B is a plan view of the mounting board 21, FIG. 13C is a plan view of a second layer of the mounting board, and FIG. 13D is a transparent plan view of the mounting board 21. FIG. 14 is a perspective view of the semiconductor package 20 according to another embodiment of the present invention.

The mounting board 21 includes, for example, multiple insulating layers. The mounting board 21 has signal conductors 26 and connection terminals 27, which are formed from a metal such as copper foil, on the upper surface of an upper one of the insulating layers. The signal conductors 26 and the connection terminals 27 are electrically connected to the side conductors 5 and the signal electrodes 33 on the lower surface with an electrically conductive bond, such as solder. High-frequency electric signals are transmitted through the signal conductors 26 and the connection terminals 27. The mounting board 21 also includes a ground layer 25 with a ground potential, which is formed from a metal such as copper foil. The ground layer 25 is located on the upper surface of the upper layer on both sides of the signal conductors 26 and surrounds the connection terminals 27 at a predetermined distance.

The ground layer 25 is joined to, with a bond such as solder, the metal layer 34 on the lower surface of the semiconductor device mounting board 1, the side ground conductors 31, and the lower surface in the mount area a formed from a metal. The mounting board 21, which includes the connection terminals 27, the signal conductors 26, and the ground layer 25 on the upper surface, forms coplanar lines, which are planar transmission lines. In a plan view, the ground layer 25 is located without overlapping the electrodes 6 and the signal electrodes 33 on the lower surface. The ground layer 25 is located without overlapping the signal lines 2 in its signal transmission direction, that is, in the direction perpendicular to the direction from the signal lines 2 to the semiconductor device 11.

The mounting board 21 includes an internal ground conductor 22. The mounting board 21 includes an occupied area 23, in which the ground conductor 22 is located, and unoccupied areas 24, in which no ground conductor 22 is located. In a plan view, the unoccupied areas 24 of the ground conductor layer is located without overlapping at least the signal electrodes 33 on the lower surface and the connection terminals 27. This structure allows the characteristic impedance to be adjusted within an intended range when the semiconductor package 20 is mounted on the mounting board 21. An electrically conductive bond, such as solder, that electrically connects the signal electrodes 33 on the lower surface to the connection terminals 27, and a meniscus formed from the bond on the side surfaces of the side conductors 5 otherwise increase the capacitance between the ground potential portion and each signal transmission portion between the signal conductor 26 and the side conductor 5, and reduce the characteristic impedance of the signal transmission portion.

In a plan view, the unoccupied areas 24 may be located inward between a pair of side ground conductors 31 (around the side conductors 5) on both sides of each side conductor 5 in the signal transmission direction of the signal lines 2, that is, in the direction perpendicular to the direction from the signal lines 2 to the semiconductor device 11. This structure reduces unintended and unstable distribution of the electric field in each signal transmission portion between the signal conductor 26 and the side conductor 5, and reduces variations in the characteristic impedance. Thus, the semiconductor device mounting board 1 further improves the frequency response in the signal transmission portion.

The present invention is not limited to the embodiments described above, and may be modified in various manners without departing from the spirit and scope of the present invention.

REFERENCE SIGNS LIST 1 semiconductor device mounting board
101 first substrate
102 second substrate
103 third substrate
a mount area b peripheral area
2 signal line
3 groove
4 feedthrough conductor
5 side conductor
6 electrode
7 first ground conductor layer
8 second ground conductor layer
9 cutout
10 recess
11 semiconductor device
12 second recess
20 semiconductor package
21 mounting board
22 ground conductor
23 occupied area
24 unoccupied area
25 ground layer
26 signal conductor
27 connection terminal
28 second connection terminal
30 gap
31 side ground conductor
32 inner surface groove
33 signal electrode on lower surface
34 metal layer on lower surface
35 metal layer on upper surface

The invention claimed is:

1. A semiconductor device mounting board, comprising:
a first substrate comprising:
an upper surface;
a side surface; and
a groove located at the side surface, the groove comprising an inner surface;
a frame on the upper surface of the first substrate, the frame comprising:
a top surface;
a bottom surface opposite to the top surface; and
a through-hole penetrating from the top surface to the bottom surface;
a feedthrough conductor inside the through-hole;
a signal line on the top surface of the frame and connected to the feedthrough conductor; and
a side conductor located on the inner surface and electrically connected to the feedthrough conductor.

2. The semiconductor device mounting board according to claim 1, further comprising:
an electrode on the bottom surface of the frame, the electrode connecting the side conductor to the feedthrough conductor,
wherein an outer edge of the electrode is inward from an outer edge of the side conductor in a bottom view.

3. The semiconductor device mounting board according to claim 2, further comprising:
a first ground conductor layer between the first substrate and the frame, the first ground conductor layer being spaced from the electrode, and
a second ground conductor layer on the top surface of the frame, the second ground conductor layer being on both sides of and spaced from the signal line.

4. The semiconductor device mounting board according to claim 1, wherein
an outer edge of the frame is outward from an outer edge of the first substrate in a plan view.

5. The semiconductor device mounting board according to claim 1, further comprising:
a second frame on the top surface of the frame,
the frame and the second frame both surrounding a mount area of the upper surface of the first substrate.

6. A semiconductor package, comprising:
the semiconductor device mounting board according to claim 1; and
a semiconductor device mountable in a mount area of the upper surface of the first substrate surrounded by the frame and electrically connected to the signal line.

7. The semiconductor package according to claim 6, further comprising:
a mounting board joined to a lower surface of the first substrate,
wherein the mounting board includes an area occupied by a ground conductor and an area unoccupied by the ground conductor inside the mounting board, and the area unoccupied by the ground conductor is located to overlap the side conductor.

8. The semiconductor device mounting board according to claim 1, wherein
the frame comprises an inner edge that is inside of the frame and an outer edge that is outside of the frame, and
the signal line is across the frame in a first direction from the inner edge to the outer edge.

9. The semiconductor device mounting board according to claim 1, wherein
the first substrate further comprises a lower surface opposite to the upper surface, and
the groove is across the side surface in a second direction from the upper surface to the lower surface.

* * * * *